United States Patent [19]

Marcus et al.

[11] Patent Number: 5,169,579

[45] Date of Patent: Dec. 8, 1992

[54] CATALYST AND PLASMA ASSISTED NUCLEATION AND RENUCLEATION OF GAS PHASE SELECTIVE LASER DEPOSITION

[75] Inventors: Harris L. Marcus; Guisheng Zong; W. Richards Thissell, all of Austin, Tex.

[73] Assignee: Board of Regents, The University of Texas System, Austin, Tex.

[21] Appl. No.: 741,869

[22] Filed: Aug. 8, 1991

Related U.S. Application Data

[63] Continuation-in-part of Ser. No. 670,416, Mar. 15, 1991, Pat. No. 5,135,695, which is a continuation-in-part of Ser. No. 444,882, Dec. 4, 1989, Pat. No. 5,017,317.

[51] Int. Cl.$^5$ .................... B29C 35/08; B29C 47/92; B23K 9/00
[52] U.S. Cl. ........................ 264/81; 118/729; 219/121.85; 427/301; 425/174.4; 156/272.8
[58] Field of Search ................ 156/643, 272.2, 272.8, 156/345, 242; 264/21, 81, 85; 425/174, 174.4; 118/715, 728–730, 50.1, 620; 427/12, 35, 38, 53.1, 248.1, 249, 255.1, 301; 219/121.12, 121.15, 121.29, 121.36, 121.6, 121.8, 121.85

[56] References Cited

U.S. PATENT DOCUMENTS 4,944,817  7/1990  Bourell et al. .................... 156/62.2
5,017,317  5/1991  Marcus ................................ 264/81

*Primary Examiner*—William A. Powell
*Attorney, Agent, or Firm*—Arnold, White & Durkee

[57] ABSTRACT

A method and apparatus for selectively depositing a layer of material from a gas phase to produce a part comprising a plurality of deposited layers. The apparatus includes a computer controlling a directed energy beam, such as a laser, to direct the laser energy into a chamber substantially containing the gas phase to preferably produce photodecomposition or thermal decomposition of the gas phase and selectively deposit material within the boundaries of the desired cross-sectional regions of the part. For each cross section, the aim of the laser beam is scanned over a target area and the beam is switched on to deposit material within the boundaries of the cross-section. Each subsequent layer is joined to the immediately preceding layer to produce a part comprising a plurality of joined layers. In an alternate embodiment of the present invention, a gas phase is condensed on a surface and a laser beam is used to selectively evaporate, transform, activate or decompose material in each layer. A catalytic environment can be created proximate or upon the target area to ensure that initial nucleation and renucleation layers are receptive to substantially rapid and uniform growth of gas phase material at the target location. The catalyst can be placed on the initial substrate layer and/or upon successive layers as the layers are being deposited on the outer surface of the evolving part.

25 Claims, 5 Drawing Sheets

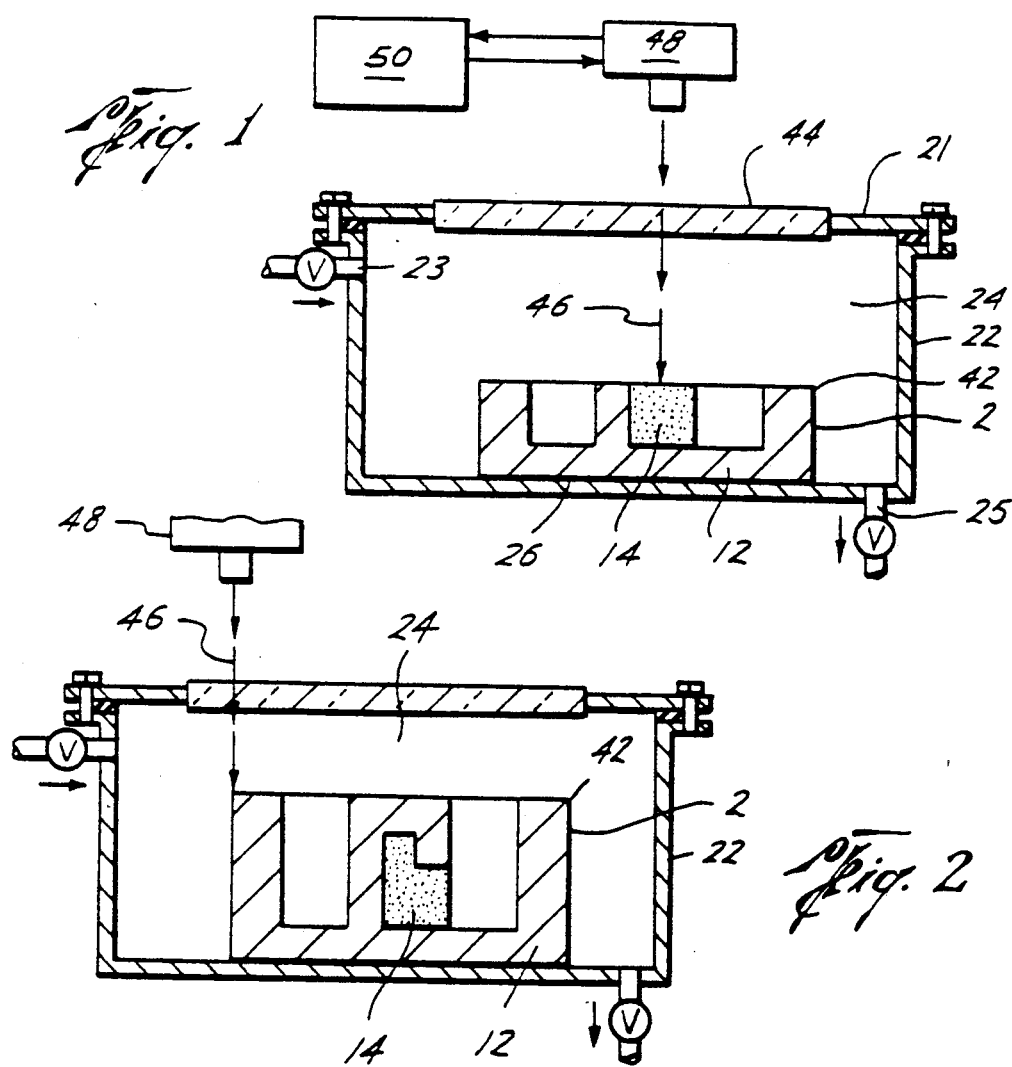
Fig. 1
Fig. 2
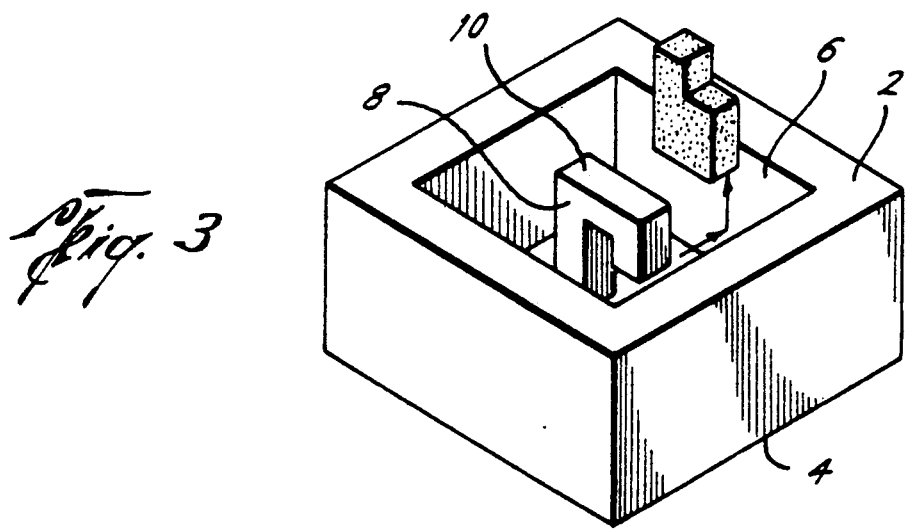
Fig. 3

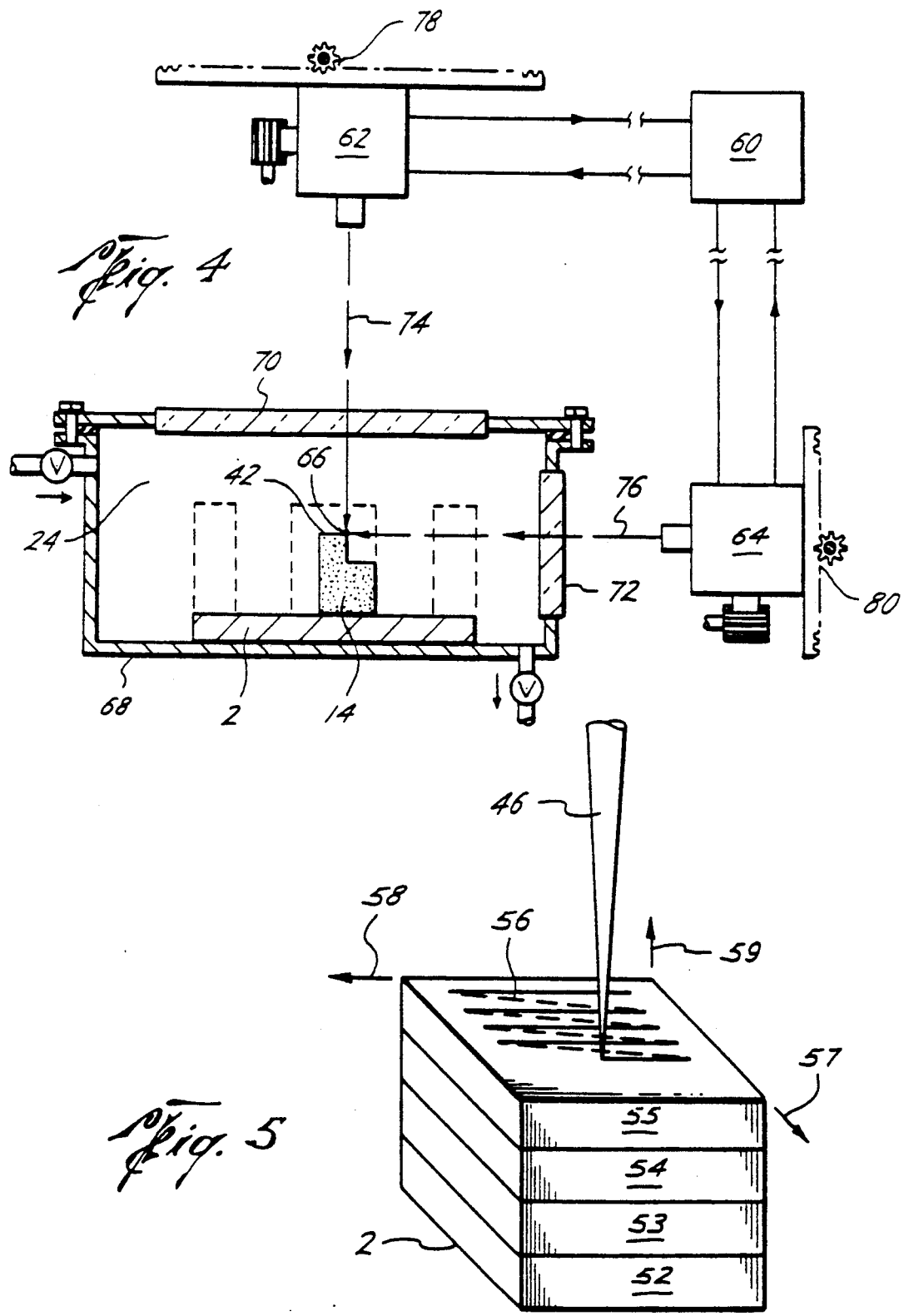

5,169,579

CATALYST AND PLASMA ASSISTED NUCLEATION AND RENUCLEATION OF GAS PHASE SELECTIVE LASER DEPOSITION

This is a continuation-in-part of patent application Ser. No. 07/670,416 filed Mar. 15, 1991, U.S. Pat. No. 5,135,695 which is a continuation-in-part of application Ser. No. 07/444,882 filed Dec. 4, 1989 now issued on May 21, 1991 as U.S. Pat. No. 5,017,317.

BACKGROUND OF THE INVENTION

I. Field of the Invention

This invention relates to a method and apparatus utilizing a directed energy beam to selectively deposit material from a gas phase or selectively evaporate material condensed from a gas phase to produce a part. In particular, this invention relates to a method of depositing a plurality of layers upon a target area which is moveable in n-degrees of freedom, the deposition being aided by a catalytic environment placed on or proximate the target area.

II. Description of the Relevant Art

The economies associated with conventional part production methods are generally related directly to the quantity of parts to be produced and the desired material characteristics of the finished parts. For example, large scale manufacture casting and extrusion techniques are often cost effective, but these production methods due to costs are generally unacceptable for small quantities—i.e. replacement parts or prototype production. Many such conventional part production methods require expensive part specific tooling. Standard powder processing requires a die for shaping the powder, making powder processing unattractive as a method for producing a small number of parts.

Where only a small number of parts are desired, conventional production methods involving a subtractive machining method are usually used to produce the desired part. In such subtractive methods, material is cut away from the starting block of material to produce a more complex shape. Examples of subtractive machine tool methods include: milling, drilling, grinding, lathe cutting, flame cutting, electric discharge machine, etc. While such conventional machine tool subtractive methods are usually effective in producing the desired part, they are deficient in many respects.

First, such conventional machine tool subtractive methods produce a large amount of waste material for disposal. Further, such machine tool methods usually involve a large initial expense for setting up the proper machining protocol and tools. As such, the set-up time is not only expensive, but relies a great deal on human judgment and expertise. These problems are, of course, exacerbated when only a small number of parts are to be produced.

Another difficulty associated with such conventional machining techniques involves tool wear—which not only involves the cost of replacement, but also reduces machining accuracy as the tool wears. Another limit on the accuracy and tolerance of any part produced by conventional machining techniques is the tolerance limits inherent in the particular machine tool. For example, in a conventional milling machine or lathe, the lead screws and ways are manufactured to a certain tolerance, which limits the tolerances obtainable in manufacturing a part on the machine tool. Of course, the tolerances attainable are reduced with the age of the machine tool.

The final difficulty associated with such conventional machine tool subtractive processes is the difficulty or impossibility of making many part configurations. That is, conventional machining methods are usually best suited for producing symmetrical parts and parts where only the exterior part is machined. However, where a desired part is unusual in shape or has internal features, the machining becomes more difficult and quite often, the part must be divided into segments for production. In many cases, a particular part configuration is not possible because of the limitations imposed upon the tool placement on the part. Thus, the size and configuration of the cutting tool do not permit access of the tool to produce the desired configuration.

There are other machining processes which are additive, for example, plating, cladding, and some welding processes are additive in that material is added to a starting substrate. In recent years, other additive-type machining methods have been developed which use a laser beam to coat or deposit material on a starting article. Examples include U.S. Pat. Nos. 4,117,302; 4,474,861; 4,300,474; and 4,323,756. These recent uses of lasers have been primarily limited to adding a coating to a previously machined article. Often such laser coating methods have been employed to achieve certain metallurgical properties obtained only by such coating methods. Typically, in such laser coating methods the starting article is rotated and the laser directed at a fixed location with the coating material sprayed onto the article so that the laser will melt the coating onto the article.

Additionally, a process for utilizing a laser to sinter a powder has been suggested in U.S. Pat. No. 4,863,538 and a process for compressing a powder-based material into a coherent mass prior to sintering has been suggested in U.S. Pat. No. 4,752,352.

A difficulty associated with previously suggested selective sintering methods relates to the problem of evenly depositing the layers of powder for sintering.

SUMMARY OF THE INVENTION

The problems outlined above and problems involved in powder handling in a laser sintering process are in large measure solved by the method and apparatus of the present invention. The present invention provides a method of producing a part on a macroscale or a microscale. A macroscale part typically comprises structural dimensions greater than about 10 microns and may further comprise suspended spans or overhanging structures within the part. A microscale part typically does not contain suspended spans or overhanging structures and may embody structural dimensions less than 10 microns.

A preferred method of the present invention comprises the steps of positioning a first gas phase proximate a target area, scanning the aim of at least one directed energy beam relative to the target area and selectively depositing material from the first gas phase in a first layer on the target area, positioning a second gas phase proximate the target area, scanning the aim of at leas one directed energy beam across the target area and selectively depositing material from the second gas phase in a second layer on the target area. This second scanning step further includes the substeps of joining the first and second layers during the scanning and depositing of the second layer and positioning successive gas phases over the target area and scanning the aim of at least one directed energy beam over the target area and selectively depositing material to produce successive layers joined to a previously deposited layer and producing a part comprising a plurality of these joined layers. Successive gas phases, including but not limited to, the first and second gas phases, may comprise substantially identical chemical compositions.

In a preferred embodiment, a non-binding easily removable material enables suspended spans or overhang structures to be formed in a subsequent layer immediately above the easily removable material. A secondary process, including, but not limited to, boiling, shaking, or a selective chemical reaction enables removal of the easily removable material having the suspended span or overhang structure in position.

The present invention may be utilized to produce parts comprising simple or multicomponent metals, ceramics, polymers, composites and combinations thereof.

The gas phases described throughout this application may comprise a plurality of gases including but not limited to organometallic, hydrocarbon, chloride, fluoride, oxide, nitride or polymer precursor gases. As used throughout this document, the term gas phases includes but is not limited to multicomponent gases and gas plasmas. Further, as used throughout this document, the terms gas phase and gas carrier include but are not limited to gases and gas plasmas. Each scanning step preferably either thermally decomposes or photodecomposes the proximate gas phase to deposit material in the target area. Additionally, the wavelength or wavelengths from the energy beam or beams is selectable to selectively deposit material from the desired gas phase. Further, the target area may be selectively heated to selectively deposit material from the gas phase and may further selectively dissociate gas molecules of the gas phase.

Another method of producing a part in accordance with the present invention comprises the steps of positioning a gas phase made up of one or more components proximate a target area, scanning the aim of at least one directed energy beam relative to the target area and selectively depositing material from the gas phase in a first layer on the target area. Subsequently, the aim of at least one directed energy beam is scanned across the target area and material is selectively deposited from the gas phase in a second layer on the target area, including the substeps of joining the first and second layers during the scanning and depositing of the second layer and successively scanning the aim of at least one directed energy beam across the target area and selectively depositing material to produce successive layers joined to a previously deposited layer and producing a part comprising a plurality of joined layers. In a preferred embodiment, the plurality of gas phases comprises gas phase precursor and gas carrier materials and plasmas thereof including but not limited to one or more combinations of $CH_4$, $C_2H_2$, $C_2H_4$, $C_2H_6$,Y $CO_2$, $Al_2(CH_3)_6$, $H_2$, He, Ar, $Ni(CO)_4$, $Fe(CO)_5$, $N_2O$, $SiH_4$, $Si_2H_6$, $TiCl_4$, $BCl_3$ and $WF_6$. Further, the selectively deposited material preferably comprises one or more combinations of directly deposited materials including not limited to amorphous C, graphitic C, diamond C, diamond-like C, TiN, $Ti_4C_3$, SiC, $Si_3N_4$, $SiO_2$, $TiB_2$, Ni, Al, Fe, W, Si, $Al_2O_3$, $TiO_2$ and TiC. A preferred embodiment enables the direct deposit of composite materials in a predetermined shape.

Each scanning step further comprises the substep of selecting at least one wavelength of the energy beam or beams to selectively deposit material from the plurality of gas phase components. In a preferred embodiment the selected beam wavelength enables the selective thermal decomposition of the plurality of gas phase components. In another preferred embodiment, the selected beam wavelength enables the selective photodecomposition of the plurality of gas phase components. In still another preferred embodiment, the selected beam wavelength enables selective thermal and photo decomposition of the plurality of gas phase components. Each scanning step further comprises the substep of selectively heating the target area to selectively deposit material from the gas phase components and further to selectively dissociate gas molecules of the gas phase components.

The gas phase components preferably comprise a plurality of organometallic, hydrocarbon, chloride, fluoride, oxide, nitride or polymer precursor gases and carrier gases that may participate in the deposition process, including but not limited to He, Ar, $H_2$, $O_2$, and $N_2$.

Yet another method of the present invention comprises the steps of positioning a first gas phase component proximate to a surface, controlling the temperature of the surface and enabling a portion of the gas phase to condense in a first layer on the surface and scanning across relative to the surface the aim of at least one directed energy beam and selectively decomposing material from the first layer. A supplemental gas phase component may, as appropriate, be positioned proximate the surface, condensed and selectively evaporated. The supplemental gas phase component preferably comprises an easily removable material including, but not limited to, $Si_2H_6$, $C_3H_8$, and Ar, enabling suspended spans or overhang structures to be formed in a subsequent layer immediately above the first condensed supplemental gas phase material. The easily removable material utilized in the fabrication of suspended spans and overhand-type structures also includes, but is not limited to, gas deposited powders.

Subsequently, another gas phase, that may contain different components, is positioned proximate to the surface. The temperature of the surface is controlled and enables a portion of the gas phase to condense on the first layer. The aim of at least one directed energy beam is scanned across the surface selectively decomposing material from the second layer including the substeps of joining the first and second layers during the condensing and scanning of the second layer and positioning successive gas phases proximate the surface, controlling the temperature of the surface and enabling a portion of the successive gas phases to condense and join in successive layers on the surface, and scanning the aim of at least one first directed energy beam across the surface and selectively evaporating layers of material and producing a part comprising a plurality of joined layers. Further, each scanning step preferably also comprises the step of scanning the aim of at least one second directed energy beam across the surface and selectively decomposing the deposited gas in each layer of material. Additionally, each scanning step preferably further comprises the substep of controlling the wavelength or wavelengths of each directed energy beam or beams.

Following formation of the spans or overhang structures, the easily removable material is preferably removed by a secondary process. A secondary process includes but is not limited to, boiling, shaking, or a selective chemical reaction.

Still another method of the present invention comprises the steps of positioning a first gas phase proximate a surface, controlling the temperature of the surface and enabling a portion of the first gas phase to condense in a first layer on the surface, scanning the aim of at least one first directed energy beam across the surface and selectively transforming material in the first layer into a material having a higher melting temperature than the condensed first gas phase material, positioning a second gas phase proximate the surface, controlling the temperature of the surface and enabling a portion of the second gas phase to condense on the first layer, scanning the aim of at least one first directed energy beam across the surface and selectively transforming material in the second layer into a material having a higher melting temperature than the condensed second gas phase material including the substeps of joining the first and second layers during the condensing and scanning of the second layer and positioning successive gas phases proximate the surface, controlling the temperature of the surface and enabling a portion of the successive gas phases to condense and join in successive layers on the surface and scanning the aim of at least one first directed energy beam across the surface and selectively transforming layers of the material and producing a part comprising a plurality of joined layers. Additionally, each scanning step preferably comprises the further step of scanning the aim of at least one second directed energy beam across the surface and selectively decomposing each layer of material. Each step of scanning preferably further comprises the substep of controlling the wavelengths of at least one directed energy beam.

An additional method of the present invention provides a method of forming an integral three-dimensional object comprising the steps of positioning a target in a chamber substantially able to contain a gas, introducing a gas phase into the chamber, utilizing means for directing an energy beam into the target area to change a property of at least part of the gas phase to deposit a layer of material and repeating the depositing and utilizing steps to form a plurality of these layers each of these layers being integrally bonded to the next adjacent layer by the utilizing steps to form an integral three-dimensional object.

An apparatus of the present invention for producing a part comprises a chamber housing a target area where the chamber enables substantial containment of a gas phase, a system for introducing a gas phase into the chamber, a system for selectively producing at least one directed energy beam, a system for directing the beam to the target area and for scanning the target area with the aim of the beam in a selective pattern, a system for controlling the operation of the beam to selectively deposit material from the gas phase on the target area during the scanning pattern including a computer system operatively coupled to the directing system to monitor the aim of the beam during the scanning pattern. The computer system is preferably programmed with information indicative of the desired boundaries of a plurality of cross-sectional regions of the part, the computer system further preferably being operable for modulating the beam when the aim of the beam is within the desired boundaries of the first cross-sectional region to deposit a first layer of material in the target area, and being able to modulate the beam when the aim of the beam is within the desired boundaries of the second cross-sectional region to deposit a second layer of material and join the first and second layers of material, and the computer system further modulating the beam when the aim of the beam is within succeeding desired boundaries of succeeding cross-sectional regions to deposit succeeding layers of material to join the layers to form the desired part.

Preferably, the computer system is programmed to the desired boundaries of a plurality of serial arranged parallel cross-sectional regions of the part. In an alternative preferred embodiment, the computer system is programmed with the overall dimensions and configuration of the part and the computer system is operative to numerically divide the part into a plurality of serial, parallel, discrete, cross-sectional regions and is able to derive the desired boundaries for each region.

In a preferred embodiment, the scanning system comprises a pair of mirrors driven by respective galvanometers. In another preferred embodiment, the scanning system comprises a system for positioning the target area relative to the beam. Further, in all preferred embodiments of the present invention the directed energy beam preferably comprises at least one laser beam, one focused incoherent optical beam, one ion beam, one electron beam, one focused plasma beam, or combination thereof.

Depositing material in accordance with the present invention avoids problems of leveling and evenly depositing material associated with attempts to mechanically deposit layers of powder in a target area for sintering by a laser beam. Depositing material utilizing the present invention preferably produces level layers joined together to form the desired part. Further, in an alternate embodiment utilizing the present invention to evaporate material condensed from a gas phase to produce the desired part, level layers are also produced and the problems associated with evenly distributing a layer of powder for sintering are largely avoided.

An alternative preferred embodiment of the present invention comprises a method and apparatus of nucleating and renucleating the gas-phase deposition of the desired phases that make up the solid freeform fabricated three-dimensional part. In particular, the alternative preferred embodiment allows for catalytic deposition of the patterned layers at a predefined target area. Target area is defined herein as the location in which energy beams transform material from a gas phase and deposits those materials onto an evolving part. Target area therefore can be either the initial substrate onto which a three dimensional part is grown, or it can be the outer layer of the part as it is being grown. Therefore a catalyst environment can be prepared on the target area, i.e., on either the initial substrate and/or on the outer layer of the growing part. Catalyst environment provides both rapid and uniform deposition of material from the gas phase by greatly increasing the nucleation density on the substrate surface or on the growing outside layer. In this invention, nucleation and renucleation refer to classical nucleation theory as well as catalytic-assisted nucleation and renucleation. Nucleation refers to the initial deposition of material onto the substrate, whereas renucleation refers to subsequent deposition on the outer surface of each layer as the part is being grown or configured. Catalytic deposition in this case is a process in which the presence of specific atoms or species on the target surface and/or in the gas phase reaction zone participating in surface reactions increases the deposition rate. These foreign atoms or species may be active in the deposition process in the way as defined in a chemical sense or as opposed to the catalysis usually considered by chemists, some fraction of them are incorporated into deposits.

The nucleation are usually impeded by the presence of nucleation barriers. Such barriers are often viewed as detrimental to the uniformity of deposits. It will be convenient to draw a distinction between nucleation barriers due to physical effects and those due to chemical effects. The first type of barrier is derived from surface tension, which impedes the nucleation of surface physical phase changes. The second type of barrier derives from surface-catalysis effects which impede the nucleation of chemical changes by surface reactions. However, according to the definition of the catalytic deposition above, any approach, which can lower or eliminate the nucleation or renucleation barrier due to either physical effects or surface-catalysis effects, is included in the catalytic-assisted nucleation or renucleation approach of the present invention.

Catalytic reaction can provide both initial nucleation and subsequent renucleation from the gas-phase directly onto the target area to form a three dimensional part. As mentioned above, initial nucleation generally takes place on the substrate to provide a starting layer which is uniform and substantially smooth in the selective pattern locations. Initial nucleation of the catalytic substrate may include a catalytic powder spread over the substrate prior to nucleation. Another catalytic-assisted nucleation approach would be to chemically modify the substrate surface bonding structure. Such a surface may be achieved by atomic-hydrogen or oxygen activation which results in substrate surface bonds being terminated by hydrogen or oxygen respectively. The resulting surface is thereby made respective to subsequent renucleation or growth. Still another approach is to slightly deform the substrate surface by mechanical means to form abundant nucleation sites. Such deformation may be achieved by polishing the substrate surface with a harder material, thereby increasing the dislocation density and crystallographic disorder near and at the surface. This disorder leads to chemically active sites on the surface that promote nucleation. Also, laser radiation can be used to locally modify surface nucleation barriers. A laser beam, for example, can be used to modify target area surface and near surface properties including but not limited to bonding structure, dislocation density, and crystallographic disorder.

Along with initial nucleation promoters, such as catalysts, placed on the target area or substrate, renucleation promoters can be utilized to provide ongoing catalytic action after the initial layer is deposited. Such forms of renucleation, or secondary nucleation, include a catalyst placed within the gas-phase. The secondary nucleation catalyst is preferably introduced as a gas into the nucleation chamber. The catalyst gas can be mixed as an integral part of the gas phase. In addition, or in lieu of the gas catalyst, a separate low pressure gas can also be introduced into the chamber which would decompose along with the gas phase to actively participate in the renucleation. An example of this behavior would be the introduction of atomic hydrogen or oxygen, under the appropriate conditions, into the area of deposition to nucleate the change of carbon deposition from amorphous carbon to diamond-like carbon.

Broadly speaking, a method of depositing a layer of material, in accordance with this alternative preferred embodiment, comprises the steps of providing a target area and preparing a catalytic environment proximate to or upon the target area. A gas phase is positioned proximate the target area and energy beams are scanned across the target area to deposit material from the gas phase onto the target area at selected scan locations of the beam. The material is then deposited in a substantially uniform pattern at each location in accordance with the catalytic environment proximate to or upon the target area.

The catalytic environment is prepared by applying a layer of catalyst upon the target area and/or by chemically or mechanically deforming the atomic bonds of the target area to allow substantial increase in the nucleation density. Either method can be used, as well as additional methods, provided that the method selected allows for rapid catalytic reaction of gas phase deposition upon the target in a three-dimensional growth pattern.

The alternative preferred method of the present invention further comprises placing a part within a sealable chamber and introducing a gas phase into the sealable chamber and proximate the outer surface or target area of the part. A catalyst powder can be introduced upon the target area within the chamber to provide initial nucleation capability. Furthermore, a catalyst gas can be introduced into the sealable chamber and within the gas phase to allow catalytic renucleation. The resulting material deposition is thereby rapid and uniform with a deposition rate as high as or even higher than 10 $\mu$m/sec. Furthermore, the nucleated and renucleated deposition layer is substantially smooth on its surface regardless of whether the surface is flat, round or oriented in the X, Y or Z dimension. Preferably, the resulting deposition layer is grown substantially void of pits or cavities. The resulting layer includes a surface topography with less than 1% variation. By controlling the process, the density can range from about 50 to about 100% of a theoretical density value.

BRIEF DESCRIPTION OF THE DRAWINGS

FIG. 1 is a sectional view of a first preferred apparatus and an example part in accordance with the present invention;

FIG. 2 is a sectional view of the part of FIG. 1, substantially near completion;

FIG. 3 is a perspective view of the part of FIG. 2;

FIG. 4 is a diagram of a second preferred apparatus in accordance with the present invention;

FIG. 5 is a schematic showing a portion of the layered buildup of a part produced in accordance with the present invention, and illustrating a raster scan pattern of the laser beam in the target area;

DETAILED DESCRIPTION OF THE PREFERRED EMBODIMENTS

Figure 6:
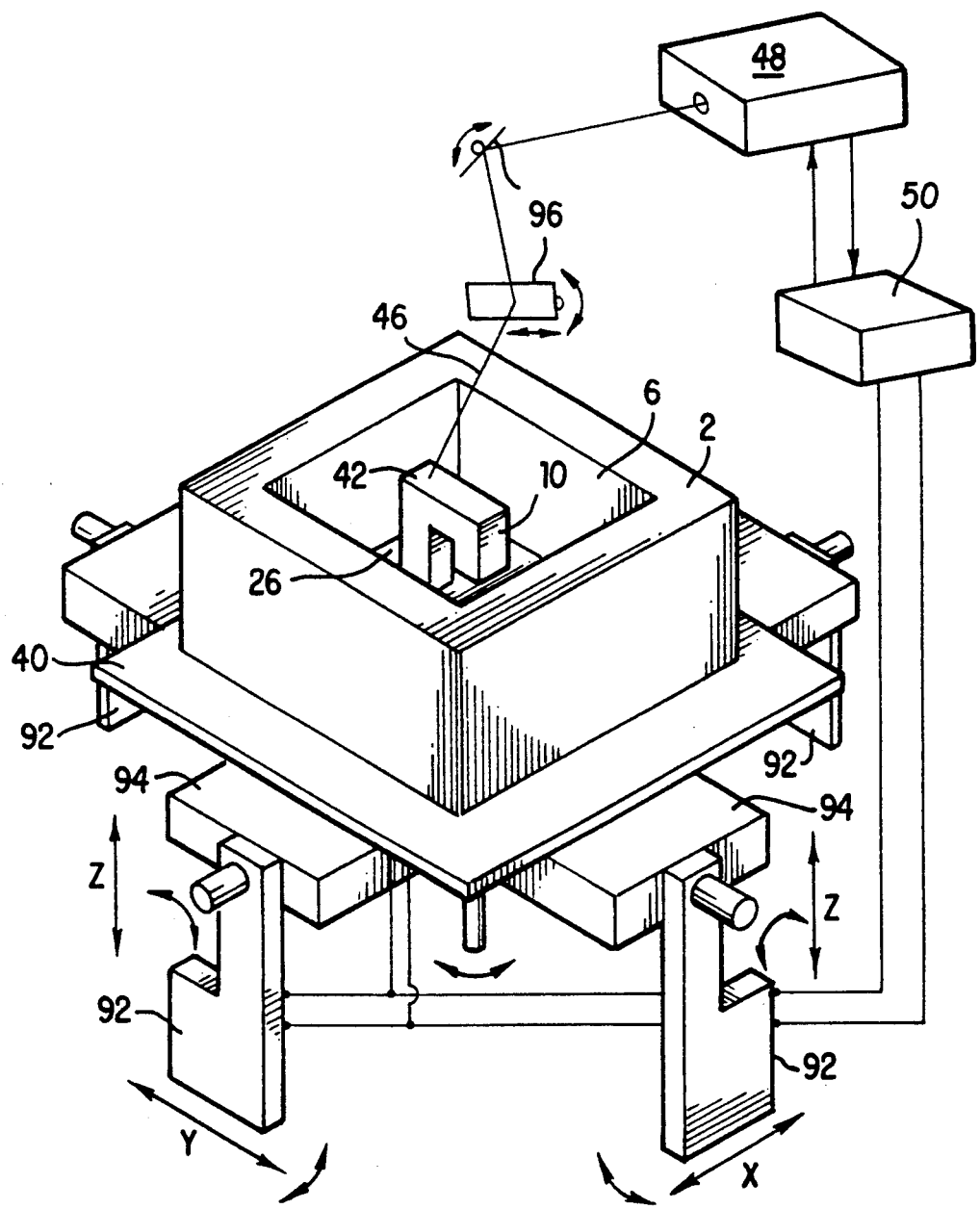
FIG. 6 is a perspective view of a part having a target area mounted upon a movable substrate stage and configured to receive a scanned energy beam of the present invention.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the intention is to cover all modifications, equivalents and alternative falling within the spirit and the scope of the invention as defined by the appended claims.

Turning now to the drawings, the method and apparatus of the present invention enable the fabrication of a variety of parts. The parts fabricated utilizing the present invention are preferably parts with structural dimensions greater than approximately 10 microns. FIG. 3 illustrates such a part. Example part 2 shows outer base structure 4 with cavity 6 positioned within part 2. Pillar 8 and overhand 10 extending from pillar 8 are positioned within cavity 6.

FIG. 1 shows part 2 within chamber 22 surrounded by gas phase 24 which is substantially contained in chamber 22. Gas inlet and valve 23 allow gas phase 24 to enter chamber 22. Gas outlet and valve 25 allow gas phase 24 to exit chamber 22. Top of chamber 22 is preferably removable to enable removal of part 2. Gas phase 24 is preferably an organometallic, hydrocarbon, chloride, fluoride, oxide, nitride or polymer precursor gas or a plurality of said gases including but not limited to He, Ar, $H_2$ and $N_2$. Organometallic gases include but are not limited to $Al_2(CH_3)_6$, $Ni(CO)_4$ and $Fe(CO)_5$. Hydrocarbon gases include but are not limited to $CH_4$, $C_2H_2$, $C_2H_4$ and $C_2H_6$. Polymer precursor gases include but are not limited to alkyl halides and amines. A gas phase preferably comprises a gas or gases having the properties of decomposing, sintering and/or polymerizing when exposed to directed energy beams that supply a sufficient thermal, decomposition or dissociation energy.

FIGS. 1 and 2 show an apparatus for producing parts in accordance with the present invention. By way of example, the part to be produced, part 2, is located within chamber 22. Gas phase 24 is substantially contained within chamber 22. Chamber 22 further comprises a beam transparent window 44 through which laser beam or beams 46 may pass. The laser beam is generated by the laser beam generating and scanning system 48 which is controlled by computer control 50. In operation, computer control 50 preferably contains information sufficient to determine the two-dimensional image of each of the plurality of layers to be deposited to form part 2. This information is transferred to laser beam generating and scanning system 48 to control laser beam 46. Laser beam 46 scans each successive top layer 42 during the fabrication of part 2 and is selectively operative to deposit binding material 12 or non-binding material 14 from gas phase 24 in the necessary pattern to produce each layer of part 2. Laser beam 46 will be active where material deposits are necessary to fabricate the current top layer 42 of part 2. Removable top of chamber 21 enables removal of completed part 2 from chamber 22. U.S. Pat. No. 4,863,538 discloses use of a computer to control a laser beam generating and scanning system, the disclosure of which is expressly incorporated herein by reference.

Where it is desired to produce a suspended span or an overhang structure in the part to be formed, preferably a non-binding, easily removable material 14 is deposited in an appropriate layer or layers prior to the first layer defining the suspended span or overhang structure. An easily removable material preferably serves to support the suspended span o overhang structure during fabrication of the part and, due to the easily removable nature of the material, it can be easily removed by a secondary process. Removal preferably is performed after fabrication of the part, thereby leaving the suspended span or overhang structure. Successive gas phases 24 enable the successive depositing of binding material 12 and easily removable material 14.

Returning to FIGS. 1 and 2, in a preferred embodiment, gas phase 24 may comprise a plurality of gases or a plurality of gas phases. Laser beam 46 may comprise a single laser beam or a plurality of laser beams coordinated to selectively thermally decompose, photodecompose, or otherwise decompose gas phase 24 to deposit material on target area 26.

The computer control 50 and laser beam generating and scanning system 48 preferably enable control of the amount of energy produced in laser beam 46 and the wavelength of laser beam 46. Therefore, in a preferred embodiment wherein gas phase 24 comprises a plurality of gases, a selected level of energy or a selected wavelength or a combination thereof for laser beam 46 enables the selective decomposition of gas phase 24. The decomposition of gas phase 24 results in the deposition of material from the gas phase on top layer 42 creating a new top layer. A laser beam of differing power or wavelengths than the initial laser beam may then be activated by computer control 50 and laser beam generating and scanning system 48 to decompose a second gas phase component and deposit a subsequent top layer on material 42 from the gas phase. In this preferred embodiment, layers of differing materials may be deposited selectively from the plurality of gaseous components comprising gas phase 24. Clearly, a single layer may contain a first area of a first deposited material and a second area of a second deposited material by providing a first gas phase and selectively scanning the energy beam across the first area and then providing a second gas phase and selectively scanning the energy beam across the second area.

In an alternative preferred embodiment, a single gas phase 24 is placed in chamber 22 through gas inlet and valve 23. Laser beam 46 thermally decomposes or photodecomposes gas phase 24 producing top layer 42. The process may be repeated to produce a second layer or the gas phase may be evacuated from chamber 22 through gas outlet and valve 25 and replaced with gas phase of another composition before a subsequent top layer 42 is deposited.

Additionally, laser beam 46 may selectively heat target area 26 to selective dissociate gas molecules from gas phase 24 and deposit material in target area 26.

By way of example, where the gas phase comprises $C_2H_2$ and $H_2$ and a $CO_2$ laser beam has an approximate energy of 20 watts at a wavelength of 10.6 microns ($\mu$m), glassy carbon can be deposited in the target area.

Still another preferred embodiment of the present invention comprises the steps of positioning a first gas phase 24 proximate to target area 26. The temperature of target area 26, and preferably chamber 22, is controlled enabling target area 26 to be at a temperature below that of the walls of chamber 22, enabling a portion of first gas phase 24 to condense in a first layer on the surface of target area 26. Turning additionally to FIG. 5, layer 52 is the first condensed layer of part 2. Laser beam 46 scans target area 26 and selectively decomposes material from layer 52. The process is repeated as shown by layers 53, 54 and 55. FIG. 5 illustrates laser beam 46 scanning layer 55 of material condensed from a gas phase. FIG. 5 illustrates raster scan pattern 56 with beam 46 selectively scanning along axis 58. The selective scan continues as the beam progresses along axis 57 until the desired area has been scanned and the appropriate layer of example part 2 completed. The part is built up, layer by layer, in the direction of axis 59. As in all preferred embodiments of the present invention, the invention enables the creation of suspended spans or overhang structures in a part. As previously described, a non-binding layer or layers of material is deposited to support the suspended span of overhang structure during fabrication. The non-binding material is then removable through a secondary process including but not limited to boiling, shaking or a selective chemical reaction. When the non-binding material is removed, the suspended span or overhang structure remains in the part.

Yet another preferred embodiment of the present invention comprises the steps of positioning a first gas phase 24 proximate target area 26. Temperature of target area 26 is controlled and enables a portion of first gas phase 24 to condense in a first layer on the surface of target area 26. Laser beam 46 scans across surface 52, as shown in FIG. 5, and selectively activates material from layer 52. The selectively activated material is transformed into a material having a higher melting temperature than the condensed first gas phase material. The process is repeated. The part is built up, layer by layer, as in all preferred embodiments, where each layer is selectively scanned and joined to the preceding layer. As in all preferred embodiments of the present invention, suspended spans or overhang structures are preferably fabricated in a part by utilizing non-binding material, such as a lower melting temperature phase material, in the layer or layers beneath the suspended spans or overhang structures so that when the temperature of target area 26 is increased, the non-activated condensed gas phase evaporates leaving the selectively activated material deposited.

Where material is condensed on target area 26 prior to scanning, gas phase 24 preferably comprises gases having a boiling point below the controllable ambient temperature of chamber 22. By way of example, gas phase 24 may comprise, but is not limited to, polymer precursors such as $C_2H_2$, $CH_3Cl$ and $(CH_3)_2NH$.

FIG. 5 illustrates the present invention evaporating undesired sections from each layer of part 2. Conversely, FIG. 1 illustrates the selective depositing of material in the appropriate layers of part 2.

Preferred embodiments of the present invention preferably include the substep of joining each layer of a binding material during the buildup process. Where material is selectively deposited, laser 46 deposits each successive layer and joins a newly deposited layer to the previously deposited layer to produce a part comprising a plurality of joined layers.

Where laser beam 46 decomposes condensed material to form a layer, each layer is joined to the previous layer preferably during the condensing of the material. This produces a part comprising a plurality of joined layers.

In all preferred embodiments of the present invention, the computer control is enabled to either determine the boundaries of a plurality of cross-sectional regions of part 2 after being programmed with the desired boundaries of the finished part or is programmed with the desired boundaries of a plurality of serially-arranged, parallel cross-sectional regions of part 2.

Where a plurality of laser beams are utilized in the present invention, the beams may be used in an additive manner to produce a desired energy level or combination of wavelengths at only the point at which the multiple laser beams are focused, referred to as the active point. A preferred embodiment utilizing two laser beams in shown in FIG. 4. Example part 2 is contained in chamber 68 and chamber 68 substantially contains gas phase 24. Computer control 60 preferably controls both first laser beam generating and scanning system 62 and second laser beam generating and scanning system 64. First laser beam 74 from first laser beam system 62 and second laser beam 76 from second laser beam system 64 enter chamber 68 through first beam transparent window 70 and second beam transparent window 72, respectively. First laser beam 74 and second laser beam 76 intersect and are preferably focused at active point 66. Laser beams 74 and 76 are preferably chosen to produce the desired level of laser energy or the desired combination of wavelengths to produce a desired material decomposition producing a material deposition on top layer 42 or part 2.

Where a plurality of laser beams are utilized, gas phase 24 preferably comprises a plurality of gases comprising characteristics enabling thermal decomposition and/or photodecomposition. Gases comprising these characteristics include, but are not limited to $C_2H_2$, $(CH_3)_2NH$ and $Ni(CO)_4$.

In an alternate preferred embodiment, active point 66 produces a desired evaporation of condensed material from top layer 42. Where a plurality of laser beams are used to evaporate material condensed from gas phase 24, gas phase 24 preferably comprises a plurality of gases comprising characteristics enabling controlled boiling in the areas exposed to the beams. Gases comprising these characteristics include, but are not limited to alkyl halides, amines and hydrocarbons mixed with carrier gases where the carrier gases include but are not limited to He, Ar and $H_2$.

Clearly, a plurality of lasers may be utilized in the present invention and the lasers may be positioned at a plurality of angles about a desired active point. The 90° angle between laser beam 74 and laser beam 76 shown in FIG. 4 is merely illustrative of a particular preferred embodiment utilizing multiple beams and is not a limitation of the method or apparatus of the present invention.

FIG. 4 further illustrates first laser positioner 78 and second laser positioner 80 both preferably controllable by computer control 60. As will be clear to one skilled in the art, controllable mirrors and other known systems are utilizable to control the positions of laser beams 74 and 76.

FIG. 6 illustrates a complex part built by a purely additive process from the inside out in order to produce overhang 10. The apparatus of FIG. 6 can controllably position the outer surface of target area 26 relative to energy beam 46 to selectively deposit material upon the outer layer of target 26. The embodiment of FIG. 6 advantageously shows direct deposition of a layer at any position to additively produce a desired overhang 10. Introduction of a plurality of ga phase components to produce difficult and easily removable layers is therefore not necessary when using the embodiment shown in FIG. 6. Direct production of part 2 is achieved by utilizing a device for positioning target 26 at various X, Y or Z directions or $\theta$, $\Phi$ or $\Psi$ angles of rotation. The device includes a movable and pivotable substrate stage 90 upon which part 2 is releasably connected. Stage 90 can be moved in either the X, Y or Z directions by any form of conventional means such as, e.g., manual crank, electrical motor and cam, hydraulic cylinder, actuator, etc. Further, stage 90 can be rotated about either the X, Y or Z axis in response to input from computer control 50. Conventional forms of stage positioners may be purchased from Klinger Scientific, Stewart Avenue, Garden City, N.Y., or from Onorad Corporation, Oser Avenue, Hauppauge, N.Y. Applicant notes however that many forms of conventional positioning devices cannot be used since they are not of high precision and adaptable for use in a gas-filled chamber of the present invention. Applicant is unaware of positioning devices which can be purchased over-the-counter and are entirely suitable in a reactive gas-filled chamber and are capable of high precision without necessary modifications.

As shown in FIG. 6, risers 92 are capable of moving or pivoting in either the X, Y or Z directions in response to commands from an external source such a computer. Furthermore, mounting brackets 94, rotatably coupled to risers 92, move in accordance with movements of risers 92. Brackets 94 can pivot in response to signal input fed to a respective riser 92 from the external source. Thus, the position of target area 26 can be moved in multiple directions to insure accurate placement of energy beam 46 upon top layer 42. The X and Y rotations of substrate 90 are achieved through two mutually perpendicular arcs for tilt adjustments similar to, e.g., a goniometer head used in X-ray diffractometers.

Also, as a further aid in positioning target area 26 to receive energy beam 46, the energy beam can be positioned and monitored. As shown in FIG. 6, one or more mirrors direct the beam over all the solid angle, in either the X, Y or Z direction. Furthermore, mirrors 96, in conjunction with scanning system 48, function to focus beam 46 in a relatively tight configuration upon outer layer 42. Thus, not only can a relatively complex part 2 be produced, but that part can be produced with relatively close dimensional tolerance in accordance with precise input from computer 50 and template stored therein.

Figure 7:
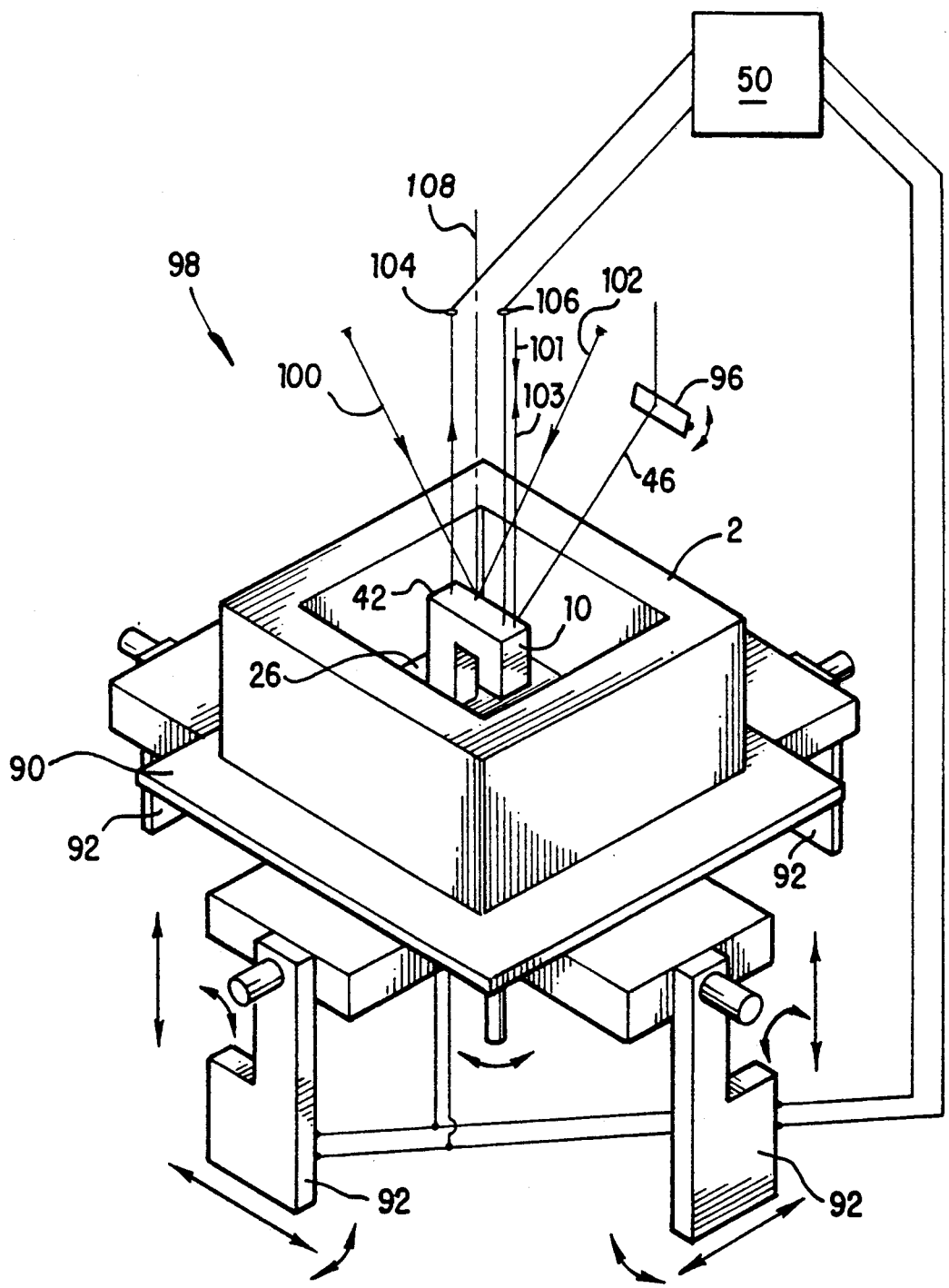
FIG. 7 is a perspective view of a part having a target area whose outer layer spatial location can be detected, monitored and moved by a computer operatively coupled between the detecting means and the moving means.

Referring to FIG. 7, a position monitoring system is shown including movable and pivotable risers 92 along with movable energy beam 46. The movable risers 92 and energy beam 46 are controlled via computer 50 which is coupled between detecting means 98 and movable risers 92. Detecting means 98 allows for a non-intrusive detection of the relative position of outer layer 42 of target area 26. More importantly, detecting means 98 non-destructively tests the dimension of the deposited material upon the outer layer 42 so as to be used in a closed loop form of control of the gas phase selective beam deposition method. The measurements of the instantaneous deposit thickness allows the part to be made to a well controlled geometry. Detecting means 98, being coupled to computer means 50, enables the present invention to define the best geometric approach to making part 2 from the inside out. FIGS. 6 and 7 show part 2 after it has substantially been built.

FIG. 7 illustrates only two forms of detecting means 98 for detecting the position and thickness of outer layer 42. Other non-intrusive forms of spatial detection can certainly be used without departing from the scope and spirit of the present invention. Detection means 98, shown in these exemplary embodiments, includes an interference method and a relative reflectance method. In the interference method, beam 101 is directed upon layer 42 resulting in beam 103 being reflected in a path to either constructively or destructively interfere with the impinging wave of beam 101. If the impinging wave and reflected wave are out-of-phase, i.e., one-half wavelength apart, then they will destructively interfere with one another. Conversely if the impinging wave and reflected wave are in-phase, i.e., one wavelength apart, then they will constructively interfere with one another. Depending upon the relatively height of layer 42 with respect to the optical source, the beams will either constructively or destructively interfere with one another. Therefore, the interference technique can non-intrusively measure the position and thickness of layer 42 as it is being grown outwardly.

If detection means includes a relative reflection methodology, reflectance from first and second light beams 100 and 102, respectively, are used to determine relative position and thickness of layer 42. Light beams 100 and 102 are modulated at frequencies dissimilar from each other so that they can be identified when reflected from the outer layer 42 and onto first and second photodetectors 104 and 106, respectively. Depending upon the distance or closeness of outer layer 42 from the photodetectors 104 and 106, or the topography or tilt of outer layer 42, the relative strengths of reflected light beams 100 and 102 will change. For example, if outer layer 42 is tilted toward photodetector 106, more of reflected energy beam 100 will be received in photodetector 106 than of reflected beam 102 received in photodetector 104. This will indicate a relative tilt of outer surface 42 by computer means 50. In response thereto, computer means 50 can instruct risers 92 to pivot or move, to increase or decrease the detected tilt. A more thorough description of non-intrusive spatial detection using the relative reflectance technique as described in U.S. Pat. No. 4,888,490, incorporated herein by reference.

In addition to being able to detect spatial position, computer means 50 also processes relative thickness of the deposited material upon outer layer 42 and the amount of unevenness, or topography, of that deposited layer. As the thickness of the deposited layer increases during deposition, outer layer 42 will extend toward the optical source 105 of beam 101, causing light beam 101 to impinge at a different wave position then when deposition was shallower. Also, if reflection technique is used, as deposited layer thickness increases toward the sources of beams 100 and 102, beams 100 and 102 will impinge upon outer layer 42 before they reach the common point or central axis 108. The separate points of impingement of beams 100 and 102 will cause photodetectors 104 and 106 to receive more of one beam than the other. In particular, first photodetector 104 will receive more of first beam 100, and second photodetector 106 will receive more of second beam 102. The relative increase in each photodetector's receipt of one energy beam as opposed to the other energy beam will indicate an increase in outer layer 42 thickness. Advantageously, the present invention allows for continuous and simultaneous monitoring of outer layer 42 thickness before, during and after deposition regardless of what detection technique is chosen.

Of major importance in achieving both rapid and uniform deposition is to provide a conducive environment for nucleation/renucleation upon the outer surface of part 2. An alternative preferred embodiment of the present invention utilizes a catalyst or initial nucleation promotor 109 placed on target area 26 or substrate upon which part 2 will be formed. In addition, a catalyst 110 can be interspersed or mixed with the gas phase 24 to provide a continuous catalytic action or renucleation of the gas phase onto outer surface 42.

Catalyst or initial nucleation promotor 109 placed on target area 26, or catalyst 110 mixed with gas phase 24, creates a catalytic environment proximate target 26. Catalyst 109 provides an initial nucleation site, whereas catalyst 110, placed within the gas phase 24 is subsequently used throughout the layering or continuous deposition process—i.e., commonly referred to as secondary renucleation.

Figure 8:
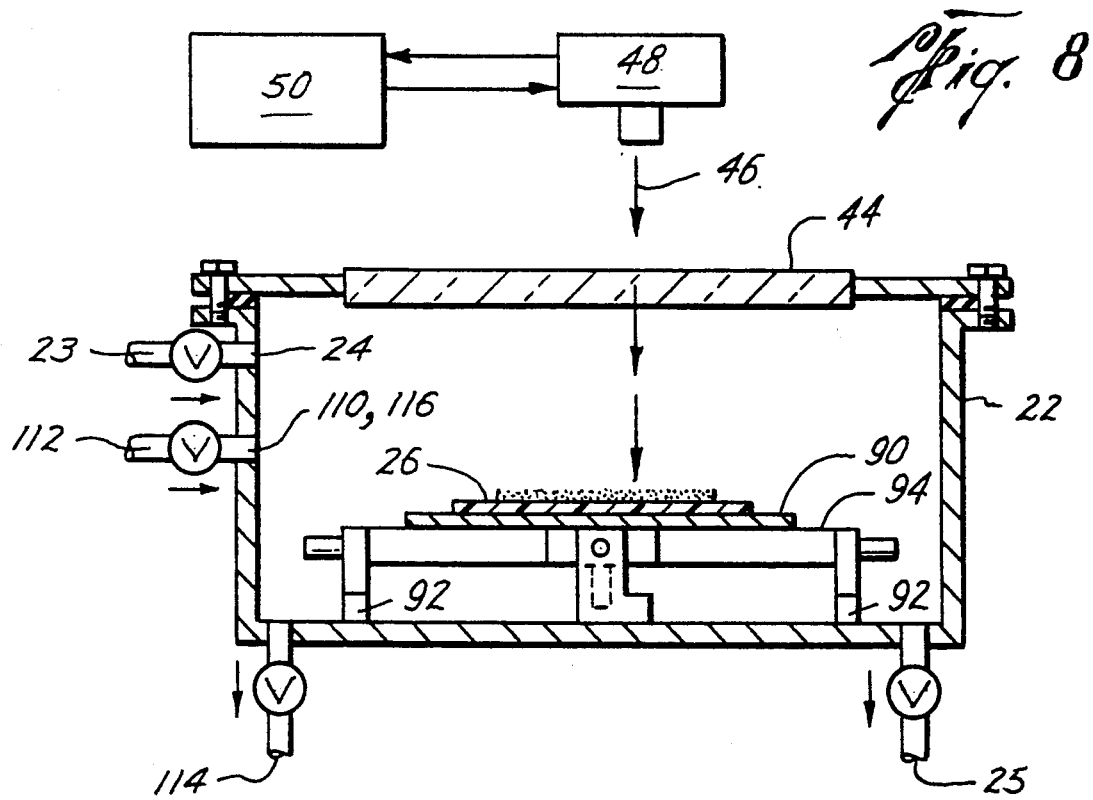
FIG. 8 is a sectional view of a target area or substrate upon which initial nucleation occurs.

FIG. 8 illustrates the initial nucleation process of adding material onto virgin target area 26 or substrate. Several types of initial nucleation promotors 109 can be used in preparing the surface of target area 26. First, a nucleation promotor 109 may include a thin layer of SiC powder mixed with sodium chloride (NaCl) powder that is present in less than 10% of the powder, and placed on target area 26 in an even distribution at least thick enough to cover the surface. The powder mixture can be introduced into chamber 22 and onto target 26 via any inlet port into the chamber.

Another initial nucleation promotor 109 may include a chemical modification of the substrate surface or target area 26 surface by chemically forming atomic-hydrogen or an oxygen activated surface layer which is highly receptive to subsequent nucleation or growth. Still further, another form of nucleation promoter 109 is the mechanical and/or chemical deformation of the substrate to form a uniform set of nucleation sites. Yet another approach to increase nucleation density is to deposit a thin intermediate layer on the substrate. This intermediate layer has the property of being able to wet or nucleate on the substrate and allow the desired deposition material to be nucleated upon it. An example of this concept is the application of a thin layer of hydrocarbon material upon a substrate. The application process may be by an aerosol or physical spreading. This hydrocarbon material may be either, but is not limited to, an oil or solution of polyarylacetylene in methylethyl ketone (MEK). Upon slow ramped heating with several hold zones to 1000° C. the hydrocarbon material carbonizes, leaving a thin layer of $sp^2$ bonded carbon, upon which diamond, amorphous diamond or diamond-like carbon can nucleate with a very high density. This intermediate deposition layer may also be achieved by physical sputtering or chemical vapor deposition of carbon.

Initial nucleation is necessary to achieve a uniform and clean initial layer on the target area or substrate upon which subsequent patterned layers can be deposited in a rapid yet smooth fashion. The present invention, as shown in FIG. 8, provides a method of obtaining an initial uniform deposit on a flat or curved substrate surface or target area 26.

It is understood that nucleation, as defined herein, is the conditions under which the laser interacting with the substrate promotes the decomposition of the gas phase and creates a deposit of one material of critical size on the existing surface. The critical size is the minimum size of a deposit which, when it grows, the deposit becomes more thermodynamically stable. The critical size is a function of the shape being nucleated and the environment in which it is nucleating. Thus, a nucleation site is any site that results in a decrease in the critical size of nucleus when compared to homogeneous gas phase nucleation. Gas phase selective laser deposition refers to chemical vapor deposition upon a surface where the area of deposition is where the energy beam impinges upon the surface.

Figure 9:
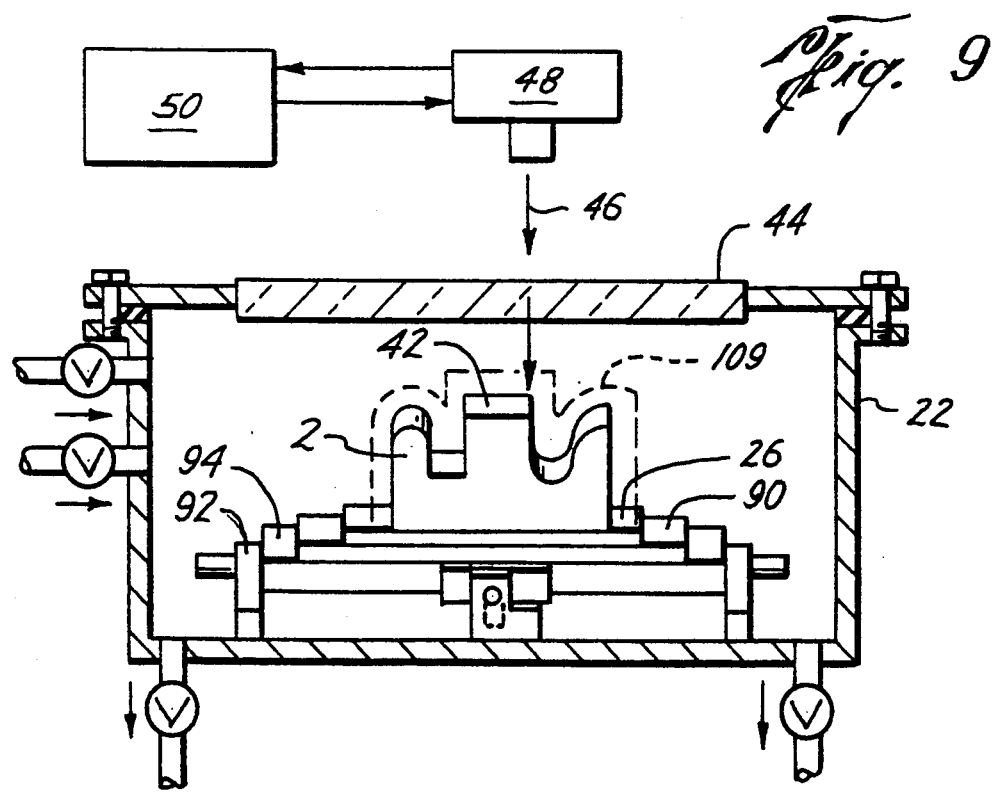
FIG. 9 is a view of an exemplary part being additively built by successive renucleation in accordance with the present invention.

FIG. 9 illustrates subsequent renucleation, i.e., renucleation after growth has begun. Renucleation can be achieved on outer layer 42 of part 2 during the buildup of part 2. Renucleation is thereby concerned with the redeposit of the same material or a redeposit of a composite type of material cumulatively added to outer layer 42 to eventually form part 2. Renucleation involves introduction of separate catalyst gas 110 into chamber 22 and into gas phase 24. Catalyst gas 110 can be of any substance which disperses in the gas phase 24. Both gas phase 24 and catalyst 110 are mixed or interspersed together within chamber 22 and proximate target area 26 or outer surface 42. Energy beam 46 is thereby scanned across target area 26 or outer layer 42 to thermally decompose or photodecompose the material from gas phase 24 onto target 26 or outer layer 42.

Shown in FIG. 9 is gas phase 24 interspersed with catalyst 110 and placed within chamber 22. Gas phase 24 is introduced within chamber 22 via gas inlet valve 23. Conversely, gas phase 24 can be evacuated from chamber 22 via gas outlet valve 25. In addition, catalyst 110 can be introduced via gas inlet valve 112 and evacuated via catalyst gas outlet valve 114. Energy beam 46 is shown traversing beam transparent window 44 and onto outer surface 42. As to be appreciated from moveable stage 90 and reciprocating risers 92, part 2, and consequently outer surface 42, can be configured in the X, Y or Z direction to receive beam 46 placed thereon. Moveable and pivotable risers 92 allow purely additive deposition in any one of numerous directions.

Catalyst 109 placed on the substrate or target area 26 will provide a substantially smooth and uniform initial layer as defined by the initial powder size of from 0.1 to 10 μm. In addition to, or in lieu of, catalyst 110, a separate low-pressure gas 116 can be introduced via input valve 112 into the area of deposition. Furthermore, low pressure gas 116 may be used to actively participate in the renucleation process. Examples of active participation to enhance the surface stability are H (atomic hydrogen) or Cl, F, etc. This prevents relaxation of dangling surface bonds leading to restructuring of $sp^3$ bonding to $sp^2$ bonding in carbon deposits. An exemplary low-pressure gas 116 is a gas having base hydrogen or oxygen which can prevent the change of carbon deposit surface from $sp^3$ bonded carbon to $sp^2$ bonded carbon. Thus, the present invention envisions diamond and diamond-like carbon growth on the outer surface 42 of part 2.

Further modifications and alternative embodiments of the apparatus and method of the present invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred and alternative preferred embodiments. Various changes may be made in the shape, size and arrangement of parts. For example, equivalent elements or materials may be substituted for those illustrated and described herein, parts may be reversed, and certain features of the invention may be utilized independently of the use of other features, all as would be apparent to one skilled in the art after having the benefit of this description of the invention. Still further, other forms of catalytic substances (powders, gases, plasma, etc.) can be utilized by the Applicant, and other forms of robotic arm positioning means and detection techniques beyond those described above certainly fall within the scope of the present invention provided, however, that the catalytic means promotes uniform and rapid growth of material upon the target area, and that the positioning means provides n-degree of positioning freedom and that the detection means is non-intrusive.

What is claimed is:

1. A method of depositing a layer of material, comprising:
   preparing a catalytic environment upon a target area;
   positioning a gas phase proximate to said target area;
   scanning an energy beam across said target area;
   depositing material from said gas phase onto said target area at select scan locations of said beam, said material being deposited in a substantially uniform pattern at said locations in accordance with the catalytic environment upon said target area.

2. The method as recited in claim 1, wherein said preparing step comprises applying a layer of catalyst powder upon said target area.

3. The method as recited in claim 2, wherein said catalyst powder comprises SiC powder mixed with NaCl powder.

4. The method as recited in claim 1, wherein said preparing step comprises modifying a structure of said target area to enhance rate of deposition of said material upon said target area.

5. The method as recited in claim 1, wherein said preparing step comprises introducing a catalyst gas into said gas phase proximate to said target area.

6. The method as recited in claim 1, wherein said scanning step comprises:
   focusing said energy beam at select boundary locations between said target area and said gas phase; and
   thermally decomposing said gas phase at said locations.

7. The method as recited in claim 1, wherein said scanning step comprises:
   focusing said energy beam at select boundary locations between said target area and said gas phase; and
   photodecomposing said gas phase at said locations.

8. A method of depositing a layer of material onto a substrate, comprising:
   providing a substrate having an upper surface layer;
   preparing a catalytic composition upon a portion of said surface layer;
   scanning an energy beam across said surface layer;
   growing material from said gas phase onto said surface layer at select scan locations of said beam, said material is grown in a substantially uniform pattern at said locations.

9. The method as recited in claim 8, wherein said substrate is flat.

10. The method as recited in claim 8, wherein said substrate is rounded.

11. The method as recited in claim 8, wherein said preparing step comprises applying a layer of catalyst powder upon said surface layer, said catalyst powder comprises SiC powder mixed with NaCl powder.

12. The method as recited in claim 8, wherein said preparing step comprises chemically modifying atomic bonds of said surface layer to enhance rate of deposition of said material upon said surface layer.

13. The method as recited in claim 8, wherein said preparing step comprises mechanically modifying the surface texture of said surface layer to enhance the rate of deposition of said material upon said surface layer.

14. A method of depositing a layer of material, comprising:
   providing a part having an outer layer;
   positioning a gas phase proximate said outer layer;
   introducing a catalyst gas into said gas phase;
   scanning an energy beam across said outer layer; and
   depositing material from said gas phase onto said outer layer at select scan locations of said beam, said material being deposited in a substantially uniform pattern at said locations in accordance with concentration of the catalytic gas within said gas phase.

15. The method as recited in claim 14, wherein said introducing step comprises injecting said catalyst gas into a chamber containing said part, said gas phase and said energy beam.

16. The method as recited in claim 14, wherein said catalyst gas comprises atomic hydrogen.

17. The method as recited in claim 14, wherein said catalyst gas comprises atomic oxygen.

18. The method as recited in claim 14, wherein said gas phase comprises at least one gas selected from the group consisting of organometallic, hydrocarbon, chloride, fluoride, oxide, nitride and polymer precursor gases.

19. A method of producing a part upon a substrate, comprising:
   providing a sealable chamber;
   placing a substrate within said sealable chamber, said substrate having an outer surface layer;
   preparing a catalytic composition upon a portion of said surface layer;
   introducing a gas phase into said sealable chamber and proximate said surface layer;
   scanning an energy beam across said surface layer;
   introducing a catalyst gas into said sealable chamber and within said gas phase;
   scanning said energy beam across said surface layer;
   depositing material from said gas phase onto said surface layer in a three dimensional growth pattern at select scan locations of said beam, said material is deposited in a substantially uniform pattern at said locations in accordance with concentration of the catalyst gas and the catalytic composition; and
   repeating the last three steps to deposit successive layers of materials comprising said part.

20. The method as recited in claim 19, wherein said depositing step comprises growing said material having a substantially smooth surface topography.

21. The method as recited in claim 20, wherein said topography comprises uniformly deposited material having less than 1% variation in thickness at said locations.

22. An apparatus for producing a part, comprising:
a gas-filled chamber;
a target area within said chamber;
a catalyst formed upon said target area; and
at least one energy beam directed upon said target area to selectively nucleate and renucleate said gas upon said target area to form a part.

23. The apparatus as recited in claim 22, wherein said catalyst comprises a catalyst powder placed upon said target area.

24. The apparatus as recited in claims 22, wherein said catalyst comprises means for modifying a structure of said target area.

25. The apparatus as recited in claim 22, wherein said catalyst comprises a catalyst gas interspersed within said gas-filled chamber.

* * * * *